(12) United States Patent
Kawamura et al.

(10) Patent No.: US 11,469,698 B2
(45) Date of Patent: Oct. 11, 2022

(54) MOTOR CONTROL DEVICE

(71) Applicant: ADVICS CO., LTD., Kariya (JP)

(72) Inventors: Hikaru Kawamura, Nagoya (JP); Tomoya Takahashi, Kasugai (JP)

(73) Assignee: ADVICS CO., LTD., Kariya (JP)

( * ) Notice: Subject to any disclaimer, the term of this patent is extended or adjusted under 35 U.S.C. 154(b) by 0 days.

(21) Appl. No.: 17/273,431

(22) PCT Filed: Sep. 3, 2019

(86) PCT No.: PCT/JP2019/034570
§ 371 (c)(1),
(2) Date: Mar. 4, 2021

(87) PCT Pub. No.: WO2020/050250
PCT Pub. Date: Mar. 12, 2020

(65) Prior Publication Data
US 2021/0320604 A1  Oct. 14, 2021

(30) Foreign Application Priority Data

Sep. 6, 2018 (JP) .............................. JP2018-166744

(51) Int. Cl.
*H02P 21/18* (2016.01)
*H02P 21/22* (2016.01)
(Continued)

(52) U.S. Cl.
CPC ........ *H02P 21/18* (2016.02); *G01R 19/16538* (2013.01); *H02P 6/18* (2013.01); *H02P 21/22* (2016.02); *H02P 21/24* (2016.02)

(58) Field of Classification Search
CPC .. H02P 21/18; H02P 6/18; H02P 21/22; H02P 21/24; H02P 6/183; G01R 19/16538
See application file for complete search history.

(56) References Cited

U.S. PATENT DOCUMENTS

2004/0066205 A1* 4/2004 Imai .................... G01D 5/2006
324/709
2014/0062353 A1   3/2014 Oyobe et al.

FOREIGN PATENT DOCUMENTS

EP   1653601 A1 *  5/2006  ............. H02P 21/18
EP   2424105 A2 *  2/2012  ............. H02P 21/26
(Continued)

OTHER PUBLICATIONS

International Search Report (PCT/ISA/210) dated Dec. 10, 2019, by the Japan Patent Office as the International Searching Authority for International Application No. PCT/JP2019/034570.
(Continued)

*Primary Examiner* — Bickey Dhakal
(74) *Attorney, Agent, or Firm* — Buchanan Ingersoll & Rooney PC (57) ABSTRACT

A motor control device includes an acquisition unit that obtains a q-axis current component of a current vector generated when electricity is supplied to a brushless motor to generate a voltage vector along a direction of an estimated d-axis; a correction unit that corrects the direction of the estimated d-axis according to the q-axis current component to approach the direction of the estimated d-axis approach to the direction of the actual d-axis; and a control axis changing unit that changes the estimated d-axis direction by a prescribed angle when a magnitude of the q-axis current component is less than a threshold value by the correction of the direction of the estimated d-axis by the correction unit for the first time after the control axis setting control start or when a magnitude of the q-axis current component is less than the threshold value at the control axis setting control start.

8 Claims, 6 Drawing Sheets

(51) Int. Cl.
  *H02P 21/24*  (2016.01)
  *H02P 6/18*  (2016.01)
  *G01R 19/165*  (2006.01)

(56) References Cited

FOREIGN PATENT DOCUMENTS

| JP | H07245981 A | 9/1995 |
| JP | H11332279 A | 11/1999 |
| JP | 2014050121 A | 3/2014 |

OTHER PUBLICATIONS

Written Opinion (PCT/ISA/237) dated Dec. 10, 2019, by the Japan Patent Office as the International Searching Authority for International Application No. PCT/JP2019/034570.

\* cited by examiner

MOTOR CONTROL DEVICE

TECHNICAL FIELD

The present disclosure relates to a motor control device that controls a brushless motor having saliency.

BACKGROUND ART

When estimating the rotor position of the brushless motor, for example, as described in Patent Literature 1, electricity is supplied to the brushless motor so that a voltage vector is generated on the estimated d-axis in the rotational coordinates of the vector control. The estimated d-axis is an axis estimated as the d-axis among the control axes of the rotational coordinates, and the axis orthogonal to the estimated d-axis among the control axes of the rotational coordinates is called the estimated q-axis. The rotor position is estimated based on the q-axis current component, which is the current component that flows in the direction of the estimated q-axis when such power supply is performed.

Figure 3:
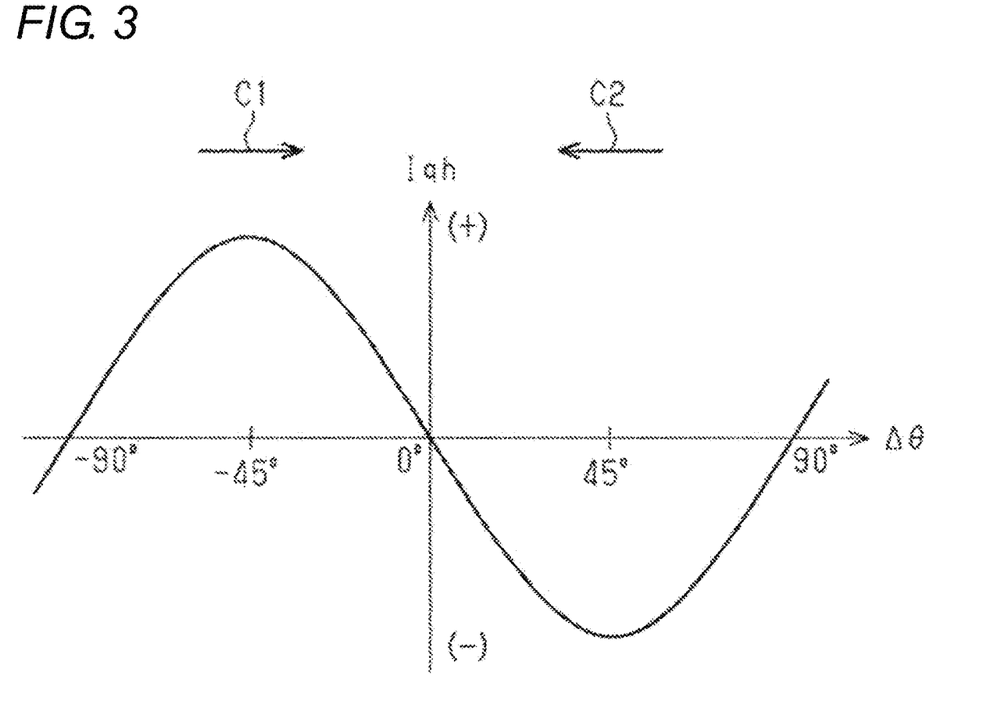
FIG. 3 is a graph showing the transition of an estimated q-axis high-frequency current when the control axis in the rotational coordinates of the vector control is continuously changed.

When the direction of the estimated d-axis is continuously changed under a situation where electricity is supplied to the brushless motor so that a voltage vector is generated on the estimated d-axis, an estimated q-axis high-frequency current Iqh, which is a value indicating the q-axis current component changes, as shown in FIG. 3. Therefore, when approaching the direction of the estimated d-axis to the direction of the actual d-axis, determination can be made that the direction of the q-axis current component of the estimated q-axis high-frequency current Iqh is a positive direction when the estimated q-axis high-frequency current Iqh is a positive value, and hence the directions of the control axes (i.e., estimated d-axis and estimated q-axis) are corrected to a first direction C1 in FIG. 3. On the other hand, since determination can be made that the direction of the q-axis current component of the estimated q-axis high-frequency current Iqh is negative direction when the estimated q-axis high-frequency current Iqh is a negative value, the direction of the estimated d-axis is corrected to a second direction C2, which is the direction opposite to the first direction C1 in FIG. 3.

CITATIONS LIST

Patent Literature

Patent Literature 1: Japanese Unexamined Patent Application Publication No. 2014-50121

SUMMARY

Technical Problems

Figure 4:
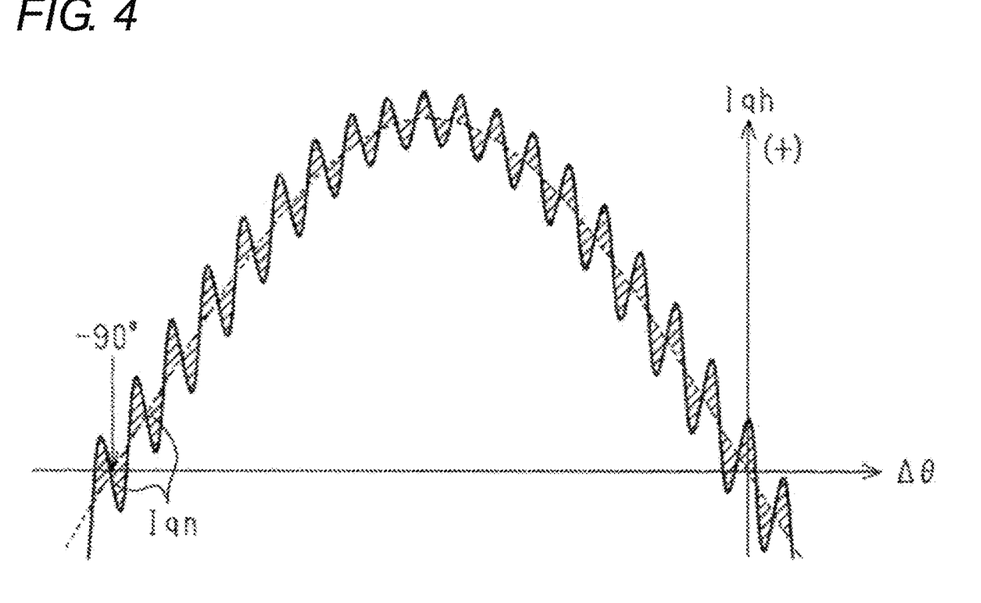
FIG. 4 is a graph showing the transition of an estimated q-axis high-frequency current on which noise components are superimposed.

When electricity is supplied to the brushless motor so that a voltage vector is generated on the estimated d-axis, a high-frequency noise component is sometimes superimposed on the obtained estimated q-axis high-frequency current Iqh, as shown in FIG. 4. In this case, if the direction of the control axis is changed when the phase difference $\Delta\theta$ is in the vicinity of "+90°" and the phase difference $\Delta\theta$ is in the vicinity of "−90°", the direction of the q-axis current component, on which the noise component is superimposed, becomes a positive direction or a negative direction. As a result, when the direction of the control axis is corrected to a direction corresponding to the direction of the q-axis current component, the correcting direction of the direction of the control axis is frequently switched and the phase difference $\Delta\theta$ may not be separated from the vicinity of "+90°" or the vicinity of "−90°".

Solutions to Problems

The motor control device for solving the above problems is a device that, when vector controlling a brushless motor, performs a control axis setting control for approaching a direction of an estimated d-axis, which is an axis estimated as a d-axis of rotational coordinates of the vector control, to a direction of an actual d-axis, which is an actual d-axis of the rotational coordinates. The motor control device includes an acquisition unit that, when an axis estimated as a q-axis of the rotational coordinates is an estimated q-axis, obtains a q-axis current component, which is a current component in a direction of the estimated q-axis, of a current vector generated on the rotational coordinates when electricity is supplied to the brushless motor to generate a voltage vector along the direction of the estimated d-axis by the control axis setting control;

a correction unit that corrects the direction of the estimated d-axis according to the q-axis current component obtained by the acquisition unit to approach the direction of the estimated d-axis to the direction of the actual d-axis during the implementation of the control axis setting control; and a control axis changing unit that, during the implementation of the control axis setting control, changes the direction of the estimated d-axis by a prescribed angle when determination is made that a magnitude of the q-axis current component obtained by the acquisition unit is less than a threshold value by the correction of the direction of the estimated d-axis by the correction unit for the first time after the start of the control axis setting control or when determination is made that a magnitude of the q-axis current component obtained by the acquisition unit is less than the threshold value at the start of the control axis setting control.

According to the above configuration, the direction of the estimated d-axis can be changed by a prescribed angle when the phase difference becomes a value in the vicinity of "+90°" or the phase difference becomes a value in the vicinity of "−90°" during the implementation of the control axis setting control. Thus, the direction of the estimated d-axis is corrected by the correction unit after the direction of the estimated d-axis is changed. That is, the correction can be continued after the phase difference is separated from "+90°", or the correction can be continued after the phase difference is separated from "−90°". Therefore, it is difficult to complete the correction of the direction of the control axis when the phase difference is a value in the vicinity of "+90°" or the phase difference is a value in the vicinity of "−90°". That is, even when a noise component is superimposed on the q-axis current component obtained during the implementation of the control axis setting control, the phase difference is easily set to a value in the vicinity of "0°" or to a value in the vicinity of "180°" by the implementation of the control axis setting control.

DESCRIPTION OF EMBODIMENT

Hereinafter, one embodiment of a motor control device will be described with reference to FIGS. 1 to 7.

Figure 1:
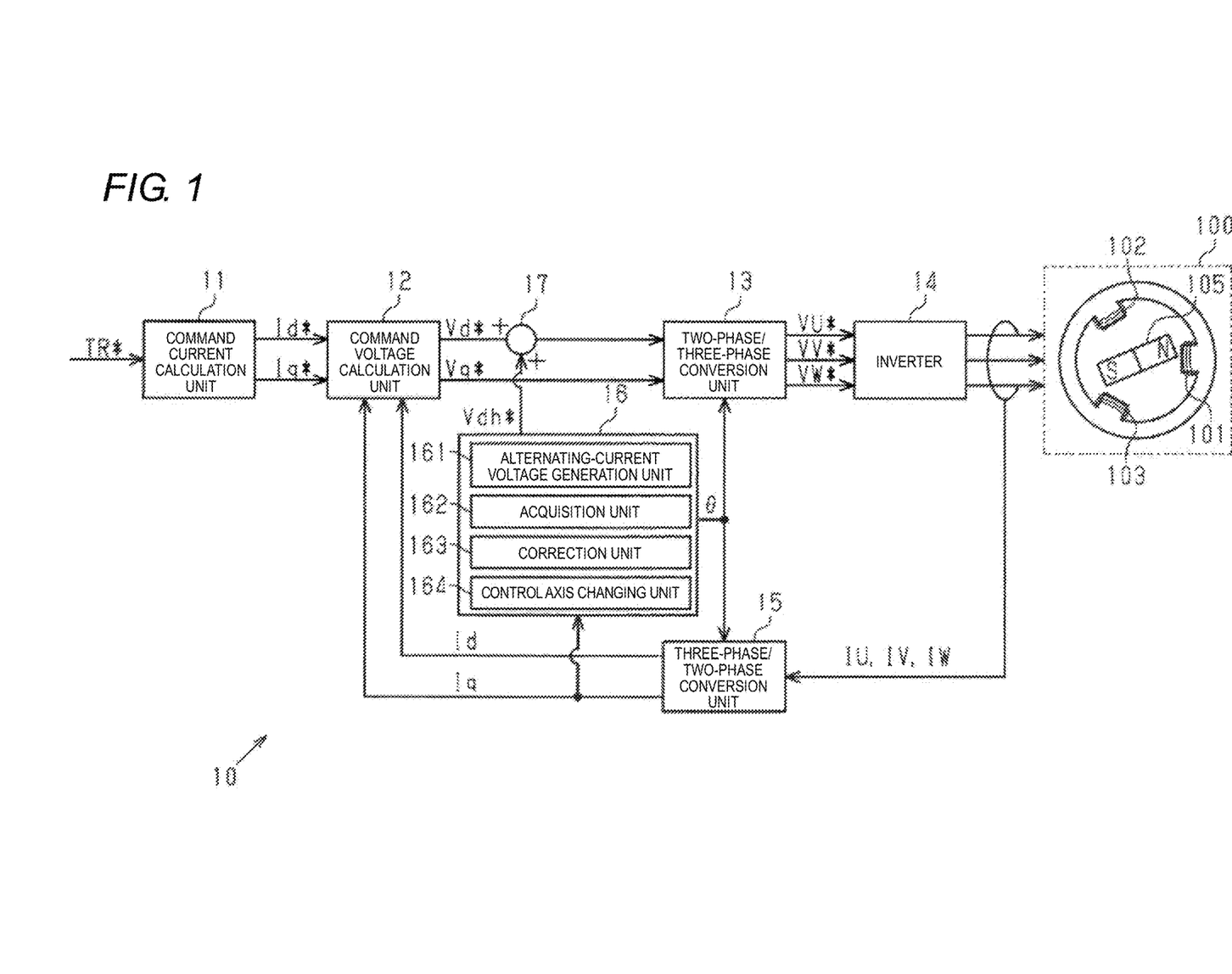
FIG. 1 is a schematic configuration diagram showing a motor control device of an embodiment and a brushless motor controlled by the motor control device.

FIG. 1 illustrates a motor control device 10 of the present embodiment and a brushless motor 100 controlled by the motor control device 10. The brushless motor 100 is used as a power source for discharging brake fluid in an on-vehicle brake device. The brushless motor 100 is a permanent magnet embedded synchronous motor. The brushless motor 100 includes coils 101, 102, 103 of a plurality of phases (U-phase, V-phase, and W-phase), and a rotor 105 having a saliency. As the rotor 105, for example, a 2-pole rotor in which each pole is magnetized to the N pole and the S pole can be mentioned.

The motor control device 10 drives the brushless motor 100 by vector control. Such a motor control device 10 includes a command current calculation unit 11, a command voltage calculation unit 12, a two-phase/three-phase conversion unit 13, an inverter 14, a three-phase/two-phase conversion unit 15, and a rotor position estimation unit 16.

The command current calculation unit 11 calculates a d-axis command current Id* and a q-axis command current Iq* based on a required torque TR* for the brushless motor 100. The d-axis command current Id* is a command value of the current component in the direction of the d-axis in the rotational coordinates of the vector control. The q-axis command current Iq* is a command value of the current component in the direction of the q-axis in the rotational coordinates. The d-axis and q-axis are orthogonal to each other on the rotational coordinates.

The command voltage calculation unit 12 calculates a d-axis command voltage Vd* by feedback control based on the d-axis command current Id* and a d-axis current Id. The d-axis current Id is a value indicating the current component in the direction of the estimated d-axis of the current vector generated on the rotational coordinates by supplying electricity to each of the coils 101 to 103 of the brushless motor 100. Furthermore, the command voltage calculation unit 12 calculates a q-axis command voltage Vq* by feedback control based on the q-axis command current Iq* and a q-axis current Iq. The q-axis current Iq is a value indicating the current component in the direction of the estimated q-axis of the current vector generated on the rotational coordinates by supplying electricity to each of the coils 101 to 103.

The estimated d-axis is an axis estimated to be the d-axis of the rotational coordinates. The actual d-axis of the rotational coordinates is called the actual d-axis. Furthermore, the actual q-axis of the rotational coordinates is called the actual q-axis, and the axis estimated to be the q-axis of the rotational coordinates is called the estimated q-axis.

The two-phase/three-phase conversion unit 13 converts the d-axis command voltage Vd* and the q-axis command voltage Vq* to a U-phase command voltage VU*, a V-phase command voltage VV*, and a W-phase command voltage VW* based on the rotor rotation angle θ, which is the position (i.e., rotation angle) of the rotor 105. The U-phase command voltage VU* is a command value of the voltage applied to the U-phase coil 101. The V-phase command voltage VV* is a command value of the voltage applied to the V-phase coil 102. The W-phase command voltage VW* is a command value of the voltage applied to the W-phase coil 103.

The inverter 14 has a plurality of switching elements. The inverter 14 generates a U-phase signal by the U-phase command voltage VU* input from the two-phase/three-phase conversion unit 13 and the on/off operation of the switching element. Furthermore, the inverter 14 generates a V-phase signal by the input V-phase command voltage VV* and the on/off operation of the switching element. Moreover, the inverter 14 generates a W-phase signal by the input W-phase command voltage VW* and the on/off operation of the switching element. Then, the U-phase signal is input to the U-phase coil 101 of the brushless motor 100, the V-phase signal is input to the V-phase coil 102, and the W-phase signal is input to the W-phase coil 103.

To the three-phase/two-phase conversion unit 15 is input, the U-phase current IU, which is the current flowing through the U-phase coil 101 of the brushless motor 100, the V-phase current IV, which is the current flowing through the V-phase coil 102, and the W-phase current IW, which is the current flowing through the W-phase coil 103. Then, the three-phase/two-phase conversion unit 15 converts the U-phase current IU, the V-phase current IV, and the W-phase current IW to the d-axis current Id, which is the current component in the direction of the d-axis, and the q-axis current Iq, which is the current component in the direction of the q-axis, based on the rotor rotation angle θ.

The rotor position estimation unit 16 estimates the rotor rotation angle θ. Through the implementation of the control axis setting control for approaching the direction of the estimated d-axis to the direction of the actual d-axis, the rotor position estimation unit 16 makes the phase difference Δθ between the direction of the actual d-axis and the direction of the estimated d-axis to approximately "0°" or approximately "180°". The phase difference Δθ referred to here is a value obtained by subtracting the direction of the actual d-axis from the direction of the estimated d-axis. Such a rotor position estimation unit 16 includes an alternating-current voltage generation unit 161, an acquisition unit 162, a correction unit 163, and a control axis changing unit 164 as functional units for performing the control axis setting control.

When bringing the direction of the estimated d-axis closer to the direction of the actual d-axis, the alternating-current voltage generation unit 161 executes a disturbance output process of generating a disturbance voltage signal Vdh* that vibrates the voltage at a high-frequency and outputting the disturbance voltage signal Vdh* to a first adder 17. When the disturbance output process is being executed by the alternating-current voltage generation unit 161, the disturbance voltage signal Vdh* is added to the d-axis command voltage Vd* calculated by the command voltage calculation unit 12, and the d-axis command voltage Vd* after the addition is input to the two-phase/three-phase conversion unit 13.

The acquisition unit 162 obtains the q-axis current component, which is the current component in the direction of the estimated q-axis, of the current vectors generated on the rotational coordinates when the control axis setting control is being performed. In the present embodiment, the acquisition unit 162 obtains the estimated q-axis high-frequency current Iqh, which is a numerical value of the q-axis current component. That is, the acquisition unit 162 obtains the estimated q-axis high-frequency current Iqh, which is a high-frequency component of the q-axis current Iq, by passing the q-axis current Iq input from the three-phase/two-phase conversion unit 15 through a bandpass filter.

The correction unit 163 performs a correcting process of correcting the direction of the estimated d-axis according to the estimated q-axis high-frequency current Iqh obtained by the acquisition unit 162 to approach the direction of the estimated d-axis to the direction of the actual d-axis.

Since the rotor 105 of the brushless motor 100 has saliency, the inductance in the direction of the q-axis may be larger than the inductance in the direction of the d-axis. In this case, if the direction of the estimated d-axis and the direction of the actual d-axis are different, a current vector declined toward the actual d-axis with respect to the voltage vector is generated when the voltage vector is generated in the direction of the estimated d-axis.

Figure 2:
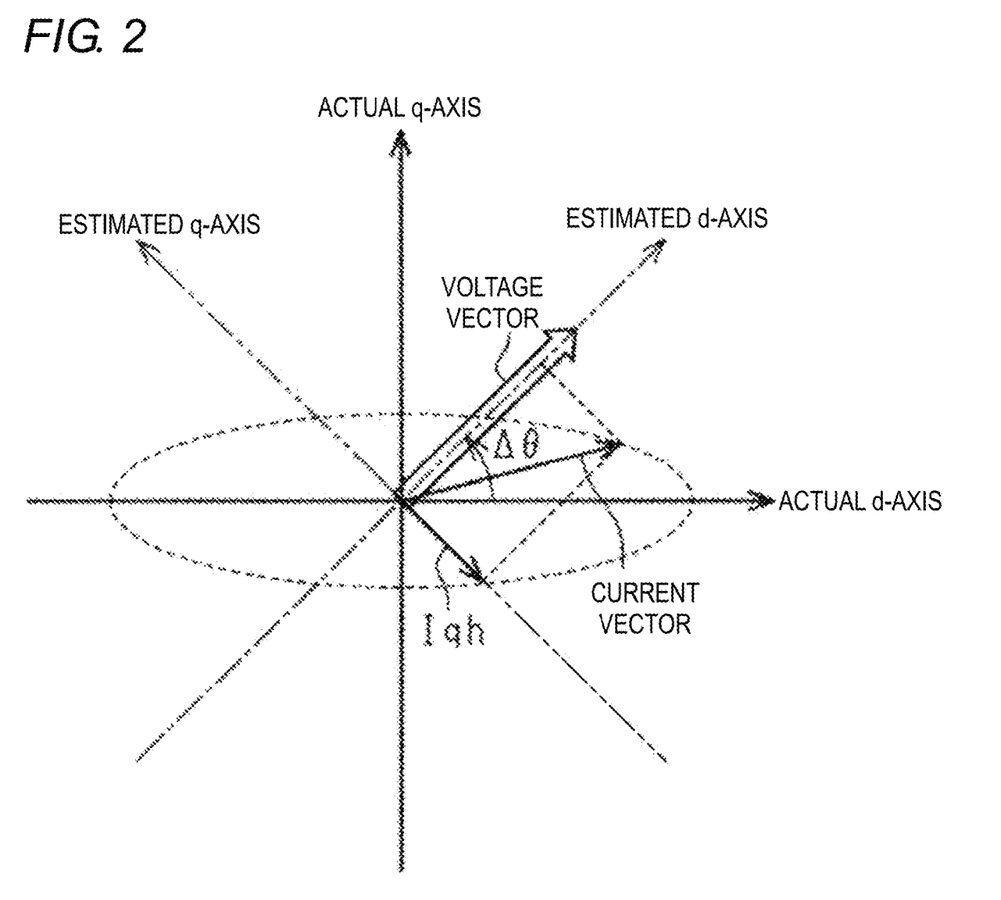
FIG. 2 is graph showing a state in which a voltage vector and a current vector are deviated when the voltage vector is generated on an estimated d-axis under a situation where an actual d-axis and the estimated d-axis are deviated.

Specifically, as shown in FIG. 2, in a case where the estimated d-axis is declined with respect to the actual d-axis, when the electricity is supplied to the brushless motor 100 so that a voltage vector is generated in the direction of the estimated d-axis, the current vector is generated so as to be declined toward the actual d-axis with respect to the estimated d-axis on the rotational coordinates. Therefore, when the estimated d-axis is declined with respect to the actual d-axis, an estimated q-axis high-frequency current Iqh, which is a current component in the direction of the estimated q-axis, is generated. The estimated q-axis high-frequency current Iqh is a current vector generated in the direction of the estimated q-axis. That is, the absolute value of the estimated q-axis high-frequency current Iqh corresponds to the magnitude of the current component in the direction of the estimated q-axis. Furthermore, the positive and negative of the estimated q-axis high-frequency current Iqh represents the direction of the current component in the direction of the estimated q-axis, that is, the positive direction or the negative direction.

On the other hand, in a case where the direction of the estimated d-axis coincides with the direction of the actual d-axis, when electricity is supplied to the brushless motor 100 so that the voltage vector is generated in the direction of the estimated d-axis, the current vector generated on the rotational coordinates is not declined with respect to the estimated d-axis. Therefore, if the estimated d-axis is not inclined with respect to the actual d-axis, no current flows in the direction of the estimated q-axis. That is, the magnitude of the estimated q-axis high-frequency current Iqh is "0".

FIG. 3 shows the transition of the estimated q-axis high-frequency current Iqh when the phase difference Δθ between the estimated d-axis and the actual d-axis is continuously changed while generating the voltage vector on the estimated d-axis. As shown in FIG. 3, the positive/negative of the estimated q-axis high-frequency current Iqh, that is, the direction of the current component in the direction of the estimated q-axis changes, or the absolute value of the estimated q-axis high-frequency current Iqh, that is, the magnitude of the current component in the direction of the estimated q-axis changes according to the change in the phase difference Δθ.

An example of a correcting process will be described with reference to FIG. 3. When the disturbance output process is executed, a voltage vector based on the disturbance voltage signal Vdh* is generated on the estimated d-axis. Then, a current vector is generated on the rotational coordinates. The current component in the direction of the estimated q-axis of such a current vector is the estimated q-axis high-frequency current Iqh.

As shown in FIG. 3, in the correcting process, when the estimated q-axis high-frequency current Iqh obtained by the acquisition unit 162 is a positive value, the correction unit 163 corrects the direction of the estimated d-axis to the first direction C1 in the figure, which is the direction of advancing the estimated d-axis, since the direction of the current component in the direction of the estimated q-axis of the estimated q-axis high-frequency current Iqh is a positive direction. On the other hand, in the correcting process, when the estimated q-axis high-frequency current Iqh obtained by the acquisition unit 162 is a negative value, the correction unit 163 corrects the direction of the estimated d-axis to the second direction C2 in the figure, which is the direction of delaying the estimated d-axis, since the direction of the current component in the direction of the estimated q-axis of the estimated q-axis high-frequency current Iqh is a negative direction. That is, the correction unit 163 corrects the direction of the estimated d-axis to a direction corresponding to the direction of the current component in the direction of the estimated q-axis of the estimated q-axis high-frequency current Iqh. Then, when the end condition is satisfied such as when the absolute value of the estimated q-axis high-frequency current Iqh obtained by the acquisition unit 162 becomes smaller than or equal to a predetermined threshold value, the correction unit 163 terminates the correcting process, and instructs the alternating-current voltage generation unit 161 to stop the disturbance output process.

Returning to FIG. 1, the control axis changing unit 164 executes a changing process of changing the direction of the estimated d-axis by a prescribed angle θA when determining that the specified execution condition is satisfied. The control axis changing unit 164 determines that the specified execution condition is satisfied when any one of the following two conditions is satisfied. (Condition 1) Determination is made, for the first time after the control axis setting control has started, that the magnitude of the estimated q-axis high-frequency current Iqh obtained by the acquisition unit 162 is less than the threshold value IqhTh due to the correction of the direction of the estimated d-axis accompanying the execution of the correcting process by the correction unit 163. (Condition 2) Determination is made that the magnitude of the estimated q-axis high-frequency current Iqh obtained by the acquisition unit 162 is less than the threshold value IqhTh at the start of the control axis setting control.

As shown in FIG. 4, a high-frequency noise component Iqn may be superimposed on the estimated q-axis high-frequency current Iqh obtained by the acquisition unit 162. In a case where the noise component Iqn is superimposed on the estimated q-axis high-frequency current Iqh, if the direction of the estimated d-axis is continuously changed, the estimated q-axis high-frequency current Iqh oscillates with "0" in between in a region in which the phase difference Δθ is in the vicinity of "+90°" and a region in which the phase difference Δθ is in the vicinity of "−90°". Thus, the region of the phase difference Δθ in which the phase difference Δθ is in the vicinity of "+90°" and the estimated q-axis high-frequency current Iqh oscillates with "0" in between, and the region of the phase difference Δθ in which the phase difference Δθ is in the vicinity of "−90°" and the estimated q-axis high-frequency current Iqh oscillates with "0" in between are referred to as "predetermined region RA" shown in FIG. 6.

The magnitude of the noise component Iqn superimposed on the estimated q-axis high-frequency current Iqh and the area of the predetermined region RA can be predicted in advance by experiments or simulations. The area of the predetermined region RA is the difference between the phase difference Δθ serving as the lower limit of the predetermined region RA, and the phase difference Δθ serving as the upper limit of the predetermined region RA. The threshold value IghTh and the prescribed angle θA are respectively set based on the magnitude of the noise component Iqn.

The threshold value IghTh is set to a value larger than or equal to the magnitude of the expected noise component Iqn. Specifically, if a value, which absolute value becomes a maximum, of the estimated q-axis high-frequency current Iqh including the noise component Iqn that transitions within the predetermined region RA is defined as a maximum current Iqhmax, the threshold value IqhTh is set to a value larger than the absolute value of the maximum current Iqhmax.

The prescribed angle θA is set to a value larger than the value of half the area of the expected predetermined region RA. Therefore, by executing the above changing process, the absolute value of the estimated q-axis high-frequency current Iqh, that is, the magnitude of the current component in the direction of the estimated q-axis can be made to a value larger than the threshold value IghTh. The changing process may be executed when the phase difference Δθ is a value in the vicinity of "0°", when the phase difference Δθ is a value in the vicinity of "180°", when the phase difference Δθ is a value in the vicinity of "+90°", and when the phase difference Δθ is a value in the vicinity of "−90°". In any case, the prescribed angle θA is set so that the phase difference Δθ does not become a value in the vicinity of "0°", the phase difference Δθ does not become a value in the vicinity of "180°", the phase difference Δθ does not become a value in the vicinity of "+90°", and the phase difference Δθ does not become a value in the vicinity of "−90°" by the execution of the changing process.

For example, the prescribed angle θA is set to a value of larger than or equal to "30°" and smaller than "60°". If the prescribed angle θA is set to a value in such a range, the phase difference Δθ does not become a value in the vicinity of "+90°" or the phase difference Δθ does not become a value in the vicinity of "−90°" by the execution of the changing process. In the present embodiment, the prescribed angle θA is assumed to be set to "45°".

Next, a processing routine executed by the rotor position estimation unit 16 in order to realize the implementation of the control axis setting control will be described with reference to FIG. 5. The execution of this processing routine is started at the start of the drive of the brushless motor 100. When the elapsed time from the start of the execution of the processing routine reaches a position estimation time TMTh1, the execution of the processing routine is terminated. That is, the position estimation time TMTh1 corresponds to the time from the start to the end of the control axis setting control.

In the first step S11 of the present processing routine, the correcting process is started by the correction unit 163. That is, prior to the start of the correcting process, the correction unit 163 instructs the alternating-current voltage generation unit 161 to execute the disturbance output process. When the execution of the disturbance output process is started by this instruction and the disturbance voltage signal Vdh* is input to the first adder 17, the correction unit 163 starts the correcting process. The correction unit 163 makes, for example, the direction of the estimated d-axis at the start of the correcting process to be the same as the direction of the estimated d-axis at the end of the previous drive of the brushless motor 100.

Then, in the next step S12, determination is made on whether or not the absolute value of the estimated q-axis high-frequency current Iqh obtained by the acquisition unit 162 during the execution of the correcting process is smaller than the threshold value IghTh. That is, determination is made on whether or not the magnitude of the current component in the direction of the estimated d-axis during the execution of the correcting process is less than the threshold value IghTh. Specifically, when a duration of a state in which the absolute value of the estimated q-axis high-frequency current Iqh is smaller than the threshold value IghTh reaches a determination duration TMTh2 during the execution of the correcting process, determination is made that the absolute value of the estimated q-axis high-frequency current Iqh is smaller than the threshold value IghTh. The determination duration TMTh2 is set to be a time shorter than the position estimation time TMTh1. For example, the determination duration TMTh2 is set to a time half of the position estimation time TMTh1 or a time shorter than the time of half of the position estimation time TMTh1.

Then, when determination is made that the absolute value of the estimated q-axis high-frequency current Iqh is smaller than the threshold value IghTh, it is determined that the specified execution conditions are satisfied. That is, in this case, the phase difference Δθ is set to one of a value in the vicinity of "0°", a value in the vicinity of "180°", a value in the vicinity of "+90°", and a value in the vicinity of "−90°".

Therefore, when determination is not made that the absolute value of the estimated q-axis high-frequency current Iqh is smaller than the threshold value IqhTh (S12: NO), the specified execution conditions are not satisfied, and hence the determination of step S12 is repeated. That is, the correction of the direction of the estimated d-axis by the execution of the correcting process is continued. On the other hand, when determination is made that the absolute value of the estimated q-axis high-frequency current Iqh is smaller than the threshold value IqhTh (S12: YES), the specified execution conditions are satisfied, and hence the process proceeds to the next step S121. In step S121, determination is made on whether or not the elapsed time from the start of the current correcting process is larger than or equal to the prescribed time TMTh3. That is, determination is made on whether or not the elapsed time from the start of the control axis setting control of when the absolute value of the estimated q-axis high-frequency current Iqh is determined to be smaller than the threshold value IghTh is larger than or equal to the prescribed time TMTh3. The prescribed time TMTh3 is set as a criterion for determining whether or not a time required from the start of the control axis setting control until determining that the absolute value of the estimated q-axis high-frequency current Iqh is smaller than the threshold value IghTh is long. That is, the prescribed time TMTh3 merely needs to be a time shorter than the position estimation time TMTh1, and may be equal to the determination duration TMTh2 or may be longer than the determination duration TMTh2.

Therefore, when the elapsed time from the start of the control axis setting control is larger than or equal to the prescribed time TMTh3, determination is made that the elapsed time is long. That is, determination is made that the remaining time in which the control axis setting control can be performed is short. On the other hand, when the elapsed time from the start of the control axis setting control is less than the prescribed time TMTh3, determination is not made that the elapsed time is long. That is, determination is not made that the remaining time in which the control axis setting control can be performed is short.

Then, when the elapsed time from the start of the control axis setting control is larger than or equal to the prescribed time TMTh3 (S121: YES), the process proceeds to step S16 described later. On the other hand, when the elapsed time from the start of the control axis setting control is less than the prescribed time TMTh3 (S121: NO), the process proceeds to the next step S13. In step S13, the execution of the correcting process is interrupted. That is, the correction of the direction of the control axis, that is, the direction of the estimated d-axis and the direction of the estimated q-axis by the correction unit 163 is interrupted. In this case, the execution of the disturbance output process by the alternating-current voltage generation unit 161 may also be interrupted.

Subsequently, in step S14, the changing process is executed by the control axis changing unit 164. Then, when the direction of the estimated d-axis is changed by the prescribed angle θA from the direction immediately before the interruption of the correcting process by the execution of the changing process, the process proceeds to the next step S15. In step S15, the execution of the correcting process by the correction unit 163 is resumed. If the execution of the disturbance output process is also interrupted when the correcting process is interrupted, the correction unit 163 instructs the alternating-current voltage generation unit 161 to resume the disturbance output process prior to resuming the correcting process. Then, when the disturbance voltage signal Vdh* is input to the first adder 17, the correction unit 163 resumes the correcting process.

Subsequently, in step S16, determination is made on whether or not the elapsed time from the start of the execution of the processing routine has reached the position estimation time TMTh1 set in advance. This elapsed time is also the duration of the implementation of the control axis setting control. The position estimation time TMTh1 is set to a length sufficient to converge the phase difference Δθ to a value in the vicinity of "0°" or a value in the vicinity of "180°". Therefore, when the elapsed time has reached the position estimation time TMTh1, the phase difference Δθ is a value in the vicinity of "0°" or a value in the vicinity of "180°", and determination is made that the above end condition is satisfied. When the elapsed time has not reached the position estimation time TMTh1 (S16: NO), the end condition is not yet satisfied, and hence the determination of step S16 is repeated. That is, the correcting process is still executed.

On the other hand, when the elapsed time has reached the position estimation time TMTh1 (S16: YES), the end condition is satisfied, and hence the process proceeds to the next step S17. In step S17, the correcting process is terminated. That is, the correction unit 163 terminates the correction of the direction of the control axis, and instructs the alternating-current voltage generation unit 161 to terminate the disturbance output process. Then, when the disturbance voltage signal Vdh* is no longer input to the first adder 17, the processing routine is terminated.

Next, the operation and effect of the present embodiment will be described with reference to FIGS. 6 and 7.

When the start of the drive of the brushless motor 100 is instructed, the correcting process is executed. Then, when determination is made that the absolute value of the estimated q-axis high-frequency current Iqh, that is, the magnitude of the current component in the direction of the estimated q-axis is less than the threshold value IqhTh, the specified execution conditions are satisfied, and hence the execution of the correcting process is interrupted. When the execution of the correcting process is interrupted in this way, there is a possibility the phase difference Δθ is a value within the predetermined region RA. The example shown in FIG. 6 is an example in which the phase difference Δθ is a value within a predetermined region RA including "−90°", and determination is made that the absolute value of the estimated q-axis high-frequency current Iqh is smaller than the threshold value IqhTh at timing t11. That is, determination is made that the specified execution conditions are satisfied.

Figure 6:
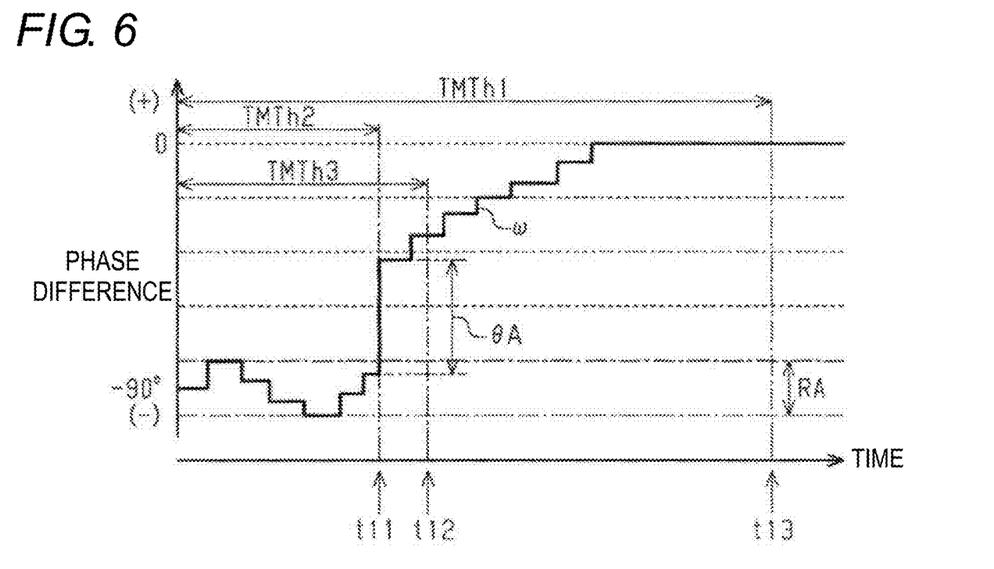
FIG. 6 is a timing chart showing the transition of the phase difference accompanying the execution of the processing routine.

Furthermore, in the example shown in FIG. 6, the timing t12 is the time point at which the elapsed time from the start of the control axis setting control reaches the prescribed time TMTh3. In this example, the elapsed time from the start of the control axis setting control reaches the prescribed time TMTh3 after determination is made that the absolute value of the estimated q-axis high-frequency current Iqh is smaller than the threshold value IqhTh.

Therefore, at the timing t11, the execution of the correcting process is interrupted, and the changing process is executed. Then, the direction of the estimated d-axis is increased by the prescribed angle A. As a result, as shown in FIG. 6, the phase difference Δθ can be set to a value outside the predetermined region RA. In the example shown in FIG. 6, a state in which the phase difference Δθ is a value in the vicinity of "−90°" shifts to a state in which the phase difference Δθ is a value between "0°" and "−90°" by the execution of the changing process. When the phase difference Δθ is greatly changed by the execution of the changing process, the direction of the estimated d-axis is greatly changed, and hence the currents IU, IV, and IW flowing through the coils 101 to 103 are changed.

When the phase difference Δθ is changed by the execution of the changing process, the correcting process is resumed. Then, the direction of the estimated d-axis is corrected to the direction corresponding to the positive/negative of the estimated q-axis high-frequency current Iqh, that is, the direction of the current component in the direction of the estimated q-axis by the execution of the correcting process. As a result, the phase difference Δθ can be brought closer to "0°" or "180°" by executing the correcting process.

Figure 7:
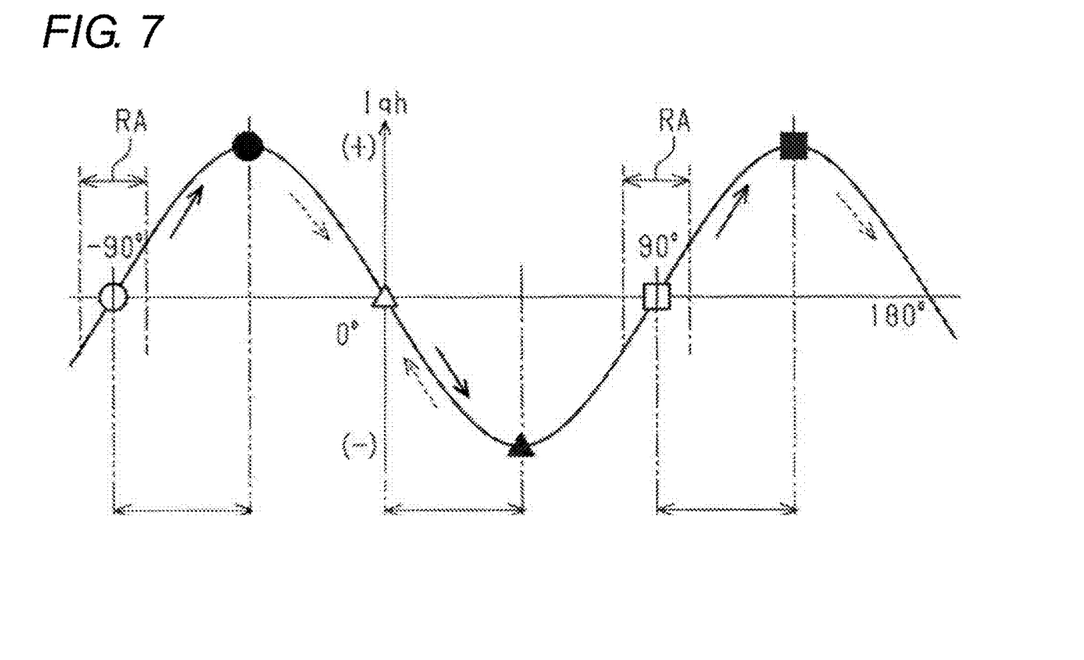
FIG. 7 is an action diagram showing the transition of the phase difference accompanying the execution of the processing routine.

Before the start of the changing process, if the phase difference Δθ is a value in the vicinity of "−90°" as indicated by the white circle in FIG. 7, the phase difference Δθ is changed as indicated by the solid line arrow in FIG. 7 when the changing process is executed. As a result, the phase difference Δθ becomes a value outside the predetermined region RA as indicated by the black circle in FIG. 7. Thereafter, when the correcting process is resumed, the direction of the estimated d-axis is corrected to the direction of bringing the phase difference Δθ closer to "0°" as indicated by the broken line arrow in FIG. 7. The timing t13 shown in FIG. 6 is the time when the position estimation time TMTh1 has elapsed from the start of the correcting process. Then, at the timing t13, the execution of the correcting process is terminated. That is, the correction of the direction of the estimated d-axis is completed. Therefore, the phase difference Δθ can be converged to a value in the vicinity of "0°".

Furthermore, before the start of the changing process, the phase difference Δθ may be a value in the vicinity of "+90°" as indicated by the white square in FIG. 7. In this case, when the changing process is executed, the phase difference Δθ is changed as indicated by the solid line arrow in FIG. 7. As a result, the state in which the phase difference Δθ is a value in the vicinity of "+90°" shifts to the state in which the phase difference Δθ is a value between "+90°" and "+180°" as indicated by the black square in FIG. 7. That is, the phase difference Δθ is a value outside the predetermined region RA. Thereafter, when the correcting process is resumed, the direction of the estimated d-axis is corrected to the direction of bringing the phase difference Δθ closer to "180°" as indicated by the broken line arrow in FIG. 7. Therefore, the phase difference Δθ can be converged to a value in the vicinity of "180°".

That is, in the present embodiment, the correction of the direction of the estimated d-axis can be suppressed from being completed in the state in which the phase difference Δθ is a value in the vicinity of "+90°" or the phase difference Δθ is a value in the vicinity of "−90°". Therefore, even when the noise component Iqn is superimposed on the estimated q-axis high-frequency current Iqh, the phase difference Δθ can be set to a value in the vicinity of "0°" or the phase difference Δθ can be set to a value in the vicinity of "180°" by implementing the control axis setting control.

When the correcting process is started by the instruction to start the drive of the brushless motor 100, the phase difference Δθ may become a value in the vicinity of "0°". That is, before the start of the changing process, if the phase difference Δθ is a value in the vicinity of "0°" as indicated by the white triangle in FIG. 7, the phase difference Δθ is changed as indicated by the solid line arrow in FIG. 7 when the changing process is executed. As a result, the phase difference Δθ is temporarily separated from "0°" as indicated by the black triangle in FIG. 7. However, even in this case, the phase difference Δθ does not become a value within the predetermined region RA. Thereafter, when the correcting process is resumed, the direction of the estimated d-axis is corrected to the direction of bringing the phase difference Δθ closer to "0°" as indicated by the broken line arrow in FIG. 7. As a result, the phase difference Δθ can be converged to a value in the vicinity of "0°".

Furthermore, before the start of the changing process, the phase difference Δθ may be a value in the vicinity of "180°". In this case, when the phase difference Δθ is changed by the execution of the changing process, the phase difference Δθ is once separated from "180°". However, even in this case, the phase difference Δθ does not become a value within the predetermined region RA. Thereafter, when the correcting process is resumed, the direction of the estimated d-axis is corrected to the direction of bringing the phase difference Δθ closer to "180°". As a result, the phase difference Δθ can be converged to a value in the vicinity of "180°".

In the present embodiment, the following effects can be further obtained.

(1) In the present embodiment, in a case where the changing process is executed when determination is made that the absolute value of the estimated q-axis high-frequency current Iqh is smaller than the threshold value IqhTh after the time at which the elapsed time from the start of the control axis setting control reaches the prescribed time TMTh3, the phase difference Δθ may not be converged to a value in the vicinity of "0°" or "180°" even if the correcting process is resumed after the execution of the changing process. This is because the time from when the correcting process is resumed until the control axis setting control is terminated is short. In this regard, in the present embodiment, when determination is made that the absolute value of the estimated q-axis high-frequency current Iqh is smaller than the threshold value IqhTh after the time at which the elapsed time from the start of the control axis setting control reaches the prescribed time TMTh3, the execution of the correcting process is continued without executing the changing process. As a result, the phase difference Δθ can be easily converged to a value in the vicinity of "0°" or a value in the vicinity of "180°" by executing the control axis setting process.

(2) In the present embodiment, the threshold value IqhTh and the prescribed angle θA are respectively set based on the expected value of the magnitude of the noise component Iqn superimposed on the estimated q-axis high-frequency current Iqh. Therefore, if the changing process is executed when the phase difference Δθ is a value within the predetermined region RA, the phase difference Δθ can be set to a value outside the predetermined region RA.

The present embodiment can be modified and implemented as follows. The present embodiment and the following modified examples can be implemented in combination with each other within a technically consistent scope.

Figure 5:
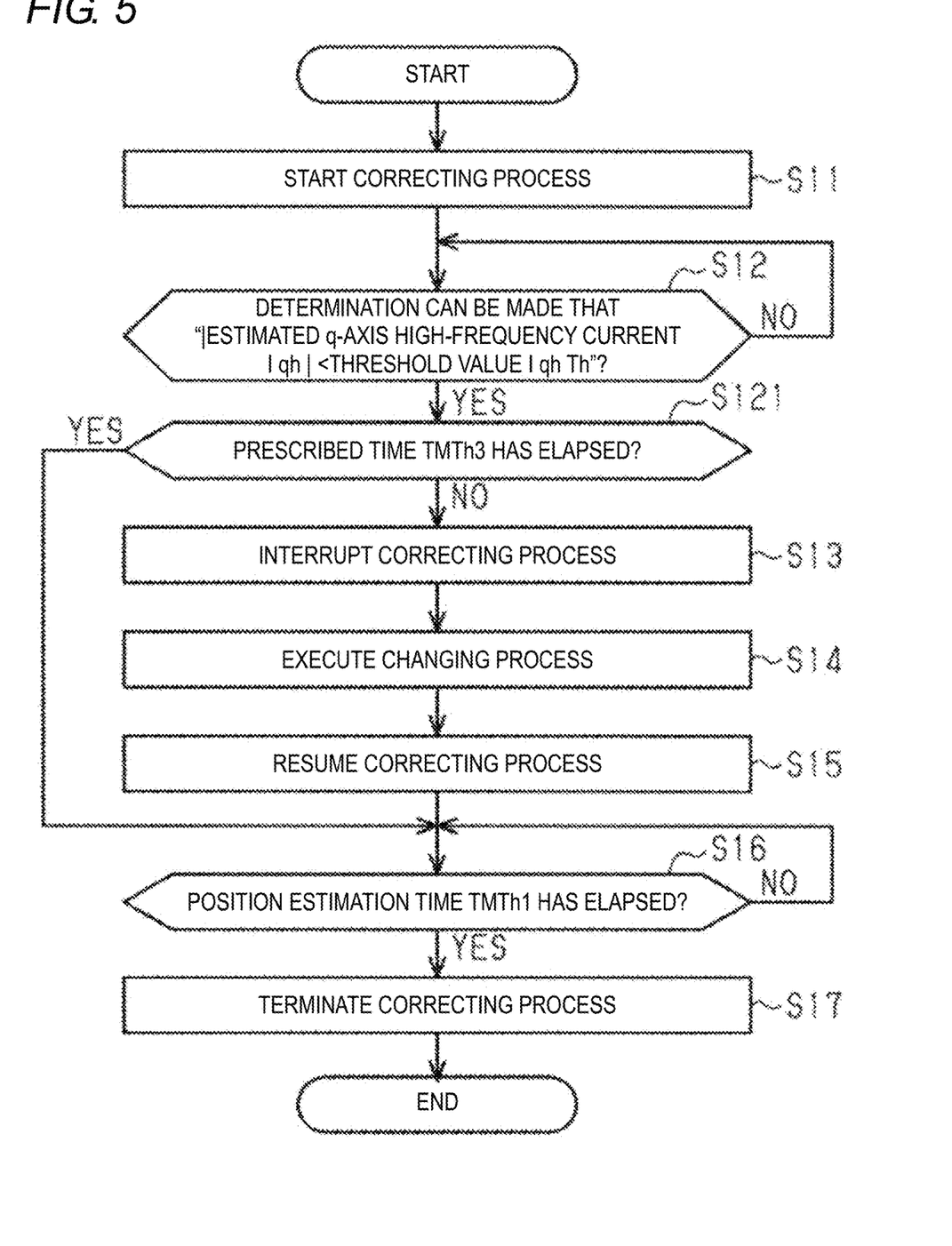
FIG. 5 is a flowchart illustrating a processing routine executed when approaching the direction of the estimated d-axis to the direction of the actual d-axis.

In the series of processes shown in FIG. 5, the determination process of step S121 may be omitted. In this case, it is preferable to extend the position estimation time TMTh1 as compared with a case where the determination process of step S121 is not omitted.

The prescribed angle θA may be set to any value other than "45°" (e.g., 55°) as long as it is a value larger than or equal to "30°" and smaller than "60°".

If the phase difference Δθ does not become a value in the vicinity of "+90°" or the phase difference Δθ does not become a value in the vicinity of "−90°" by the execution of the changing process, the prescribed angle θA may be set to a value outside the range of larger than or equal to "30°" and smaller than "60°". For example, any value within the range of larger than or equal to "−30°" and smaller than "−60°" may be set as the prescribed angle θA.

The correcting process may be a process having a content different from the content described in the above embodiment as long as the direction of the estimated d-axis can be brought closer to the direction of the actual d-axis.

In the above embodiment, in the changing process, the phase difference Δθ is changed at once by the prescribed angle θA as shown in FIG. 6. However, if the phase difference Δθ can be changed by the prescribed angle θA by executing the changing process, the phase difference Δθ may be changed in a plurality of stages (e.g., two stages and three stages) toward the target phase angle. The target phase angle referred to here is a value obtained by adding the prescribed angle θA to the phase difference Δθ before the start of the changing process.

When determination can be made that the phase difference Δθ has converged to a value in the vicinity of "0°" or a value in the vicinity of "180°", the correcting process resumed after the execution of the changing process may be terminated before the above elapsed time reaches the position estimation time TMTh1.

In the series of processes shown in FIG. 5, when the determination of step S12 is "YES", this is assumed to mean that the specified execution conditions are satisfied. The determination on whether or not the specified execution conditions are satisfied may be made through other methods other than the method described in the above embodiment. For example, when determination can be made that the fluctuation amount of the estimated rotor position θdc, which is the estimated value of the rotation angle of the rotor 105, is less than the threshold value θdcTh, it may be determined that the specified execution conditions are satisfied.

Figure 8:
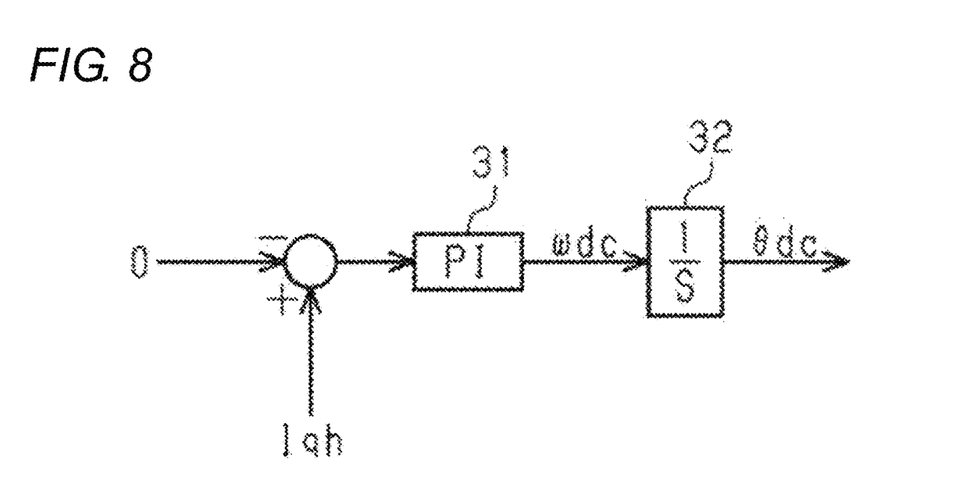
FIG. 8 is a block diagram showing an arithmetic circuit for calculating an estimated rotor speed.

For example, the estimated rotor position θdc can be calculated as shown in FIG. 8. That is, the estimated rotor position θdc can be obtained by obtaining the estimated rotor speed ωdc by proportionally integrating the estimated q-axis high-frequency current Iqh by a first arithmetic unit 31, and further integrating the estimated rotor speed ωdc by a second arithmetic unit 32.

If a state in which the absolute value of the estimated q-axis high-frequency current Iqh is smaller than the threshold value IghTh is continued, the estimated rotor position θdc barely changes. Therefore, the fact that the duration of the state in which the absolute value of the estimated q-axis high-frequency current Iqh is smaller than the threshold value IghTh is longer than or equal to the determination duration TMTh2, and the fact that the fluctuation amount of the estimated rotor position θdc is less than the threshold value θdcTh are synonymous. Therefore, determining that the specified execution conditions are satisfied when the fluctuation amount of the estimated rotor position θdc becomes less than the threshold value θdcTh, and executing the subsequent processes are also included in the interpretation of the present disclosure.

Specifically, a processing routine for performing the control axis setting control using the fluctuation amount of the estimated rotor position θdc will be described with reference to FIG. 9. The difference between the processing routine in this case and the processing routine in FIG. 5 is that the process of step S12A and the process of step S12B are executed instead of the determination process of step S12. That is, each process after step S121 is the same.

Figure 9:
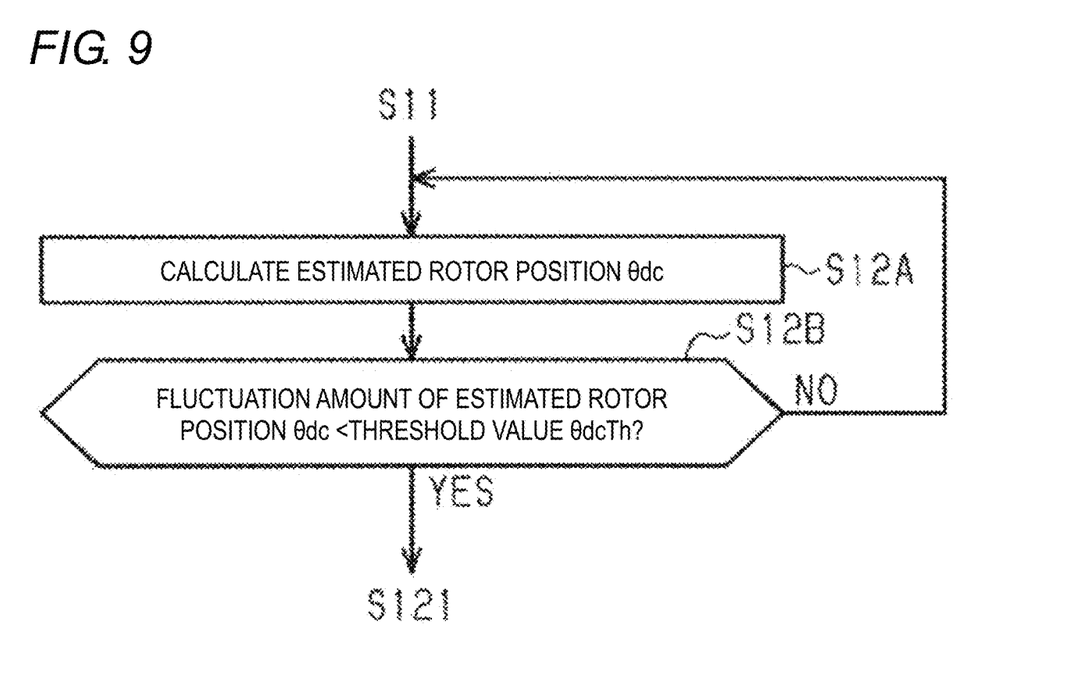
FIG. 9 is a flowchart illustrating a part of a processing routine executed when approaching the direction of the estimated d-axis to the direction of the actual d-axis in a modified example.

As shown in FIG. 9, when the correcting process has started in step S11, in the next step S12A, the estimated rotor position θdc is calculated based on the estimated q-axis high-frequency current Iqh obtained by the acquisition unit 162 during the execution of the correcting process. Then, in step S12B, determination is made on whether or not the fluctuation amount of the estimated rotor position θdc is less than the threshold value θdcTh. Specifically, when the duration of the state in which the fluctuation amount of the estimated rotor position θdc is less than the threshold value θdcTh reaches the determination duration TMTh2, determination is made that the fluctuation amount of the estimated rotor position θdc is less than the threshold value θdcTh. The fluctuation amount of the estimated rotor position θdc can be calculated from, for example, the difference between the estimated rotor position θdc obtained for the first time and the estimated rotor position θdc obtained after the first time.

Then, when determination is not made that the fluctuation amount of the estimated rotor position θdc is less than the threshold value θdcTh (S12B: NO), the process proceeds to step S12A described above. On the other hand, when determination is made that the fluctuation amount of the estimated rotor position θdc is less than the threshold value θdcTh (S12B: YES), determination can be made that the specified execution conditions are satisfied. Thus, the process proceeds to the next step S121.

In a case where determination is made that the fluctuation amount of the estimated rotor position θdc is larger than or equal to the threshold value θdcTh even once during the determination on whether or not the specified execution conditions are satisfied, that is, when the process of step S12A and the process of step S12B are being executed, it may be determined that the specified execution conditions are not satisfied. When determination is made that the specified execution conditions are not satisfied in this way, the process proceeds to step S16.

The motor control device 10 may be configured as one or more processors that operate according to a computer program (software), one or more dedicated hardware circuits such as dedicated hardware (application specified integrated circuit: ASIC) that executes at least a part of various processes, or a circuit including a combination thereof. The processor includes a CPU and memories such as RAM and ROM, where the memory stores program codes or commands configured to cause the CPU to execute processing. The memory, that is, the storage medium includes any available medium accessible by a general purpose or dedicated computer.

The rotor 105 applied to the brushless motor 100 may be a 4-pole rotor instead of a 2-pole rotor.

The brushless motor to which the motor control device 10 is applied may be a power source of an actuator different from the on-vehicle brake device.

The invention claimed is:

1. A motor control device that, when vector controlling a brushless motor, performs a control axis setting control for approaching a direction of an estimated d-axis which is an axis estimated as a d-axis of rotational coordinates of the vector control, to a direction of an actual d-axis which is an actual d-axis of the rotational coordinates, the motor control device comprising:
   an acquisition unit that obtains a q-axis current component which is a current component in a direction of an estimated q-axis of a current vector generated on the rotational coordinates when electricity is supplied to the brushless motor to generate a voltage vector along the direction of the estimated d-axis by the control axis setting control, the estimated q-axis is an axis estimated as a q-axis of the rotational coordinates;
   a correction unit that corrects the direction of the estimated d-axis according to the q-axis current component obtained by the acquisition unit to approach the direction of the estimated d-axis to the direction of the actual d-axis during the implementation of the control axis setting control; and
   a control axis changing unit that, during the implementation of the control axis setting control, changes the direction of the estimated d-axis by a prescribed angle when determination is made that a magnitude of the q-axis current component obtained by the acquisition unit is less than a threshold value by the correction of the direction of the estimated d-axis by the correction unit for the first time after the start of the control axis setting control or when determination is made that a magnitude of the q-axis current component obtained by the acquisition unit is less than the threshold value at the start of the control axis setting control.

2. The motor control device according to claim 1, wherein the q-axis current component obtained by the acquisition unit is expected to include a noise component, and the threshold value is set to a value larger than or equal to a magnitude of the expected noise component.

3. The motor control device according to claim 2, wherein the q-axis current component obtained by the acquisition unit is expected to include a noise component, and the prescribed angle is set based on a magnitude of the expected noise component.

4. The motor control device according to claim 2, wherein the control axis changing unit changes the direction of the estimated d-axis by the prescribed angle under a condition that an elapsed time from the start of the control axis setting control when determination is made that the magnitude of the q-axis current component is less than the threshold value is less than a prescribed time, and the prescribed time is shorter than a time from the start to the end of the control axis setting control.

5. The motor control device according to claim 3, wherein the control axis changing unit changes the direction of the estimated d-axis by the prescribed angle under a condition that an elapsed time from the start of the control axis setting control when determination is made that the magnitude of the q-axis current component is less than the threshold value is less than a prescribed time, and the prescribed time is shorter than a time from the start to the end of the control axis setting control.

6. The motor control device according to claim 1, wherein the q-axis current component obtained by the acquisition unit is expected to include a noise component, and the prescribed angle is set based on a magnitude of the expected noise component.

7. The motor control device according to claim 6, wherein the control axis changing unit changes the direction of the estimated d-axis by the prescribed angle under a condition that an elapsed time from the start of the control axis setting control when determination is made that the magnitude of the q-axis current component is less than the threshold value is less than a prescribed time, and the prescribed time is shorter than a time from the start to the end of the control axis setting control.

8. The motor control device according to claim 1, wherein the control axis changing unit changes the direction of the estimated d-axis by the prescribed angle under a condition that an elapsed time from the start of the control axis setting control when determination is made that the magnitude of the q-axis current component is less than the threshold value is less than a prescribed time, and the prescribed time is shorter than a time from the start to the end of the control axis setting control.

* * * * *